United States Patent
Zydek et al.

(10) Patent No.: US 6,201,479 B1
(45) Date of Patent: Mar. 13, 2001

(54) SWITCHING ARRANGEMENT FOR MONITORING LEAKAGE CURRENT

(75) Inventors: Michael Zydek, Langgöns; Wolfgang Fey, Niedernhausen; Micha Heinz, Darmstadt, all of (DE)

(73) Assignee: Continental Teves AG & Co., OHG (DE)

( * ) Notice: Subject to any disclaimer, the term of this patent is extended or adjusted under 35 U.S.C. 154(b) by 0 days.

(21) Appl. No.: 09/284,928

(22) PCT Filed: Oct. 15, 1997

(86) PCT No.: PCT/EP97/05684

§ 371 Date: Jul. 20, 1999

§ 102(e) Date: Jul. 20, 1999

(87) PCT Pub. No.: WO98/18014

PCT Pub. Date: Apr. 30, 1998

(30) Foreign Application Priority Data

Oct. 24, 1996 (DE) .............................................. 196 44 181

(51) Int. Cl.[7] .................................................. G08B 21/00
(52) U.S. Cl. .......................... 340/664; 340/636; 340/650; 340/651; 340/660; 73/129; 361/23; 324/511
(58) Field of Search .................................... 340/664, 660, 340/654, 644, 636, 650, 651; 73/117.2, 129; 361/23, 31, 20, 18, 30, 191; 324/511

(56) References Cited

U.S. PATENT DOCUMENTS

| | | |
|---|---|---|
| 4,375,672 * | 3/1983 | Kato et al. ............................ 364/551 |
| 5,099,198 | 3/1992 | Bleckmann et al. . |
| 5,245,495 * | 9/1993 | Bailey et al. ............................ 361/23 |
| 5,528,445 * | 6/1996 | Cooke et al. ............................ 361/20 |

FOREIGN PATENT DOCUMENTS

| | | |
|---|---|---|
| 42 07 568 | 9/1992 | (DE) . |
| 42 42 177 | 6/1994 | (DE) . |
| 43 38 462 | 5/1995 | (DE) . |
| 195 26 435 | 12/1996 | (DE) . |
| 0 418 665 | 3/1991 | (EP) . |

OTHER PUBLICATIONS

Search Report of the German Patent Office for Application No. 196 44 181.1.

* cited by examiner

Primary Examiner—Benjamin C. Lee
Assistant Examiner—Davetta W. Goins
(74) Attorney, Agent, or Firm—Rader, Fishman & Grauer PLLC

(57) ABSTRACT

A circuit arrangement for monitoring leakage currents of a circuit which includes a plurality of valve coils connected in parallel to a supply line and adapted to be connected to ground by way of individual switches, and wherein the supply line is connected by way of a main switch to the positive pole of the supply voltage source and, further, to a testing current source used as a test signal source, is designed such that prior to each closing of the main switch, with the individual switches still open, the testing current source is connected to the supply voltage source and thereby activated. The result is an increase of the voltage potential on the supply line. A comparator establishes the difference between the potentials on the supply line and the supply voltage. If the difference exceeds a threshold value, this indicates leakage current.

5 Claims, 2 Drawing Sheets

SWITCHING ARRANGEMENT FOR MONITORING LEAKAGE CURRENT

TECHNICAL FIELD

The present invention relates to current detection circuit and more particularly relates to a circuit arrangement for monitoring leakage currents.

BACKGROUND OF THE INVENTION

German patent application No. 42 42 177 (P 7433) discloses a circuit arrangement of this type which is used to monitor valve coils of a controlled brake system and the associated actuating stages. The valve coils are connected to the positive pole of the vehicle battery by way of a joint main switch or a (semiconductor) relay, on the one hand, and grounded by way of each one final stage or an individual switch, on the other hand. To detect leakage currents, an auxiliary voltage source is connected, by way of a high-ohmic resistor, to the joint supply line which leads from the main switch to the valve coils. The potential on this supply line is measured and evaluated when the main switch is open. The potential on the supply line changes in the event of a shunt or leakage current from the supply line to the supply source or to ground. Shifts in potential which are due to leakage currents are detected and signalled by way of a voltage divider and a potential monitor.

Further, it has been disclosed in a circuit, which is similar to the above circuit in other respects, to connect the auxiliary voltage source that is used for testing purposes by way of a current source which can be comprised of two anti-parallel connected individual current sources. As long as the fault current is within predetermined limit values, the potential on the joint supply line remains approximately constant, while already an insignificant exceeding of these limit values will cause a remarkable (therefore easy to assess) potential variation on the supply line during the testing period (German patent application No. 195 26 435.5, not prior published).

U.S. Pat. No. 5,099,198 discloses a circuit for monitoring the final stages of a plurality of coils which permits detecting failure of the stages and the occurrence of leakage currents or shortcircuits. The final stages are actuated by test signals for error detection. The reactions caused thereby are identified by logical linking of the output signals and evaluated for error detection.

Further, EP-A-0 418 665 discloses a circuit for actuating and monitoring a plurality of coils and the associated final stages, for example, the valve coils of electrically controlled hydraulic valves of an anti-lock system, by way of a joint computer. Fault monitoring and fault determination is performed.

Assigned to each coil is a logic circuit including several detector circuits which respond to various functional faults of the coil circuits (such as shortcircuit, line interruption, permanent signal). The associated logic circuits are actuated selectively by the joint control and test computer for monitoring the individual coils.

An object of the present invention is to develop a circuit arrangement of the above-mentioned type which permits detecting leakage currents or shunts of various types with a particularly high degree of reliability. Another important objective is a simple design and ease of analysis of the test results.

It has been found that this object is achieved by the circuit arrangement of the present invention which includes a current source as an auxiliary or test signal source which is connected to the supply voltage source, and is thereby activated, prior to each closing of the main switch, with the individual switches still open. Subsequently, the occurring voltage potential on the supply line is determined and evaluated for leakage current detection.

In the test period, i.e., after the activation of the testing current source, the potential on the supply line is increased until almost the total value of the supply voltage or battery voltage by the circuit arrangement according to the present invention. In contrast to known circuits with a low auxiliary voltage and/or high-ohmic resistors in the testing path, the increase of potential to the battery potential level also permits detecting shunts which occur or are caused only at a relatively high voltage level. Impurity spots and defects in the crystal lattice structure of semiconductors may cause shunts which become active only starting with a certain voltage potential. This behavior can be compared with the Zener effect where current flow occurs only above a defined voltage value, i.e., the Zener voltage.

In a preferred aspect of the present invention, the difference between the potential on the supply line and the potential of the supply voltage source is determined in the test period, i.e., after the activation of the testing current source, by way of a comparator. When the difference exceeds a defined, relatively low voltage threshold value, this indicates a shunt or a leakage current. This type of error detection is especially easy to achieve and it is reliable.

It is appropriate to evaluate the potential difference which is produced as a consequence of the activation of the testing current source only after a defined waiting time in order to also cover an induced current which flows via an inductive load, especially via one of the valve coils. This is because due to inductance the potential variation on the supply line will occur under certain conditions only after a defined delay time as a consequence of activation of the testing current source.

DETAILED DESCRIPTION OF THE PREFERRED EMBODIMENTS

Figure 1:
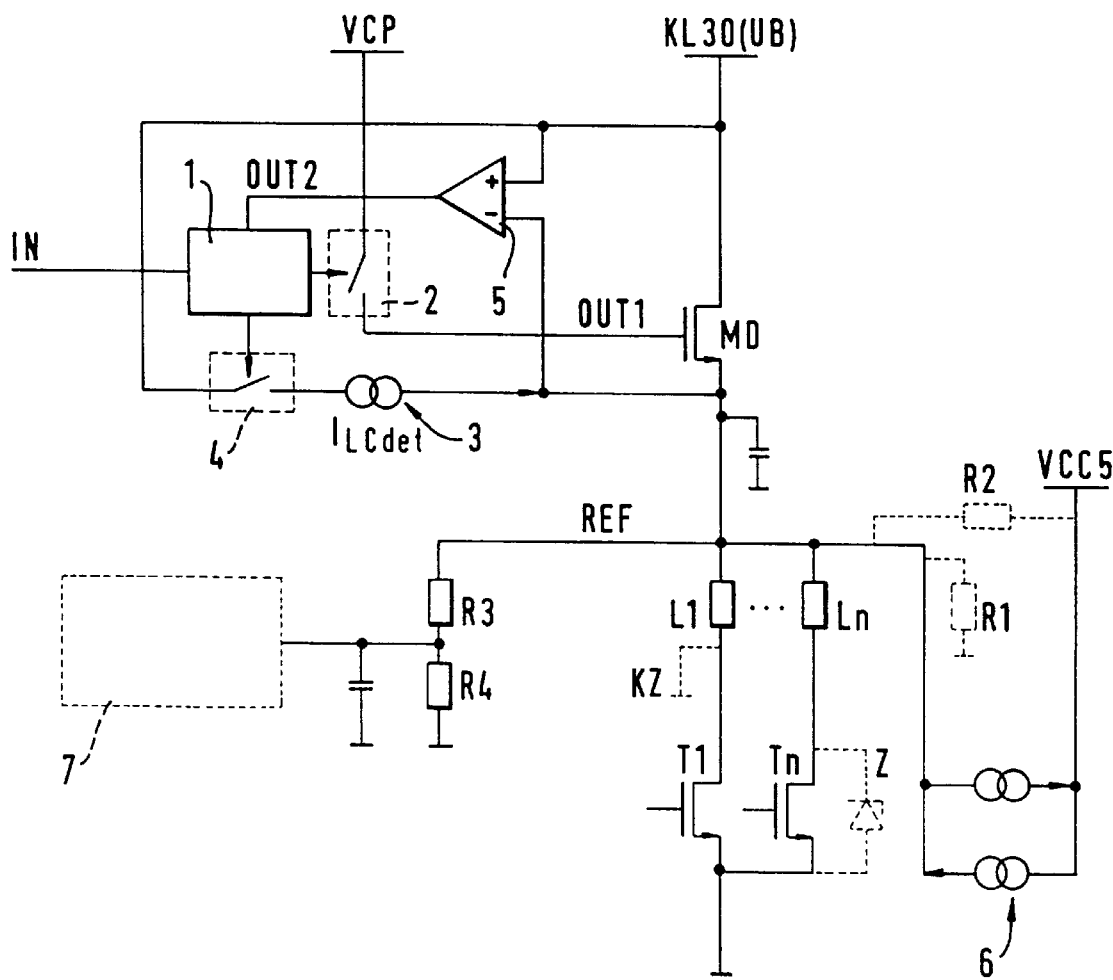
FIG. 1 is a schematically simplified view of the block wiring diagram showing the basic components of a circuit arrangement of the present invention.

In the embodiment of FIG. 1, a valve coil circuit arrangement is shown which is mainly comprised of several or a plurality of parallel connected valve coils L1 to Ln which are switched on and off by way of individual switches or driver stages T1 to Tn. Further included is a main switch or main driver MD. The current is supplied, as is normal in an automotive vehicle, via the vehicle terminal KL30 which, in the present example, leads to the positive pole of the vehicle battery with the voltage UB and via the represented ground connection. Consequently, the main driver MD is also referred to as a high-side-driver, and the individual switches or transistors T1 to Tn are referred to as low-side-drivers.

Comprised among the basic components of the valve circuit is also the actuation control of the main switch MD by a logic circuit or logic 1. When an input signal IN is applied, a gate signal or actuating signal OUT1 for switching on the main switch or closing of the MD is produced by way of the logic circuit 1 and a switch 2. VCP is the actuating voltage necessary for the main driver MD which must be in excess of the battery voltage UB in such a circuit.

As is known, the main switch MD is closed upon commencement of the control until a controlled braking operation is completed in a circuit of the illustrated type which is used to actuate the valve coils of a controlled brake system. Subsequently, braking pressure control is performed by application of variable pulse trains by way of the individual switches or low-side-drivers T1 to Tn. The pulse duration, pulse trains, pulse-pause conditions, etc., are calculated and predetermined by the control logic (not shown) of the brake system.

According to the present invention, a leakage current check is carried out prior to each activation of the main driver MD or closing of the main switch. When leakage currents are detected which exceed allowable minimum values, the leakage current monitoring system prevents the activation and closing of the main switch MD.

According to FIG. 1, a current source 3 is provided for leakage current monitoring. For performing the testing operation, current source 3 is activated by way of a switch 4, actuated by logic 1, and connection to the supply voltage or battery voltage. The supply voltage prevails at terminal KL30. The main switch MD and the individual switches T1 to Tn are open during this testing operation. Current source 3 is rated for a load-independent current of 30 milliampere, for example. In the absence of a shunt, or if the shunt or leakage current does not exceed a predetermined limit value, the current source causes the potential on the supply line REF to rise until (almost) the potential of the supply voltage or battery voltage UB (terminal 30). Now it is only necessary to determine the difference between the potential on the supply line REF and the potential on the terminal KL30 by way of a comparator 5. If the difference is below a predetermined limit value in the range between e.g. 1 to 2 volt, this indicates that the circuit is intact.

Therefore, comparator 5 signals to the logic 1 the testing result (OUT2). When no shunt or leakage current is detected, switch 4 will be opened again, and current source 3 will thereby be deactivated. The main driver or high-side-driver MD will be driven by way of switch 2.

Some shunt variations occurring in the practice are indicated in dotted lines in FIG. 1. Grounded line KZ close to L1 represents a shortcircuit. Shunts to ground and to an auxiliary voltage source VCC5 (such auxiliary voltage sources are normally used with circuits of the above-mentioned type) produce leakage currents of different magnitudes. An outlined Zener diode Z which is disposed in parallel to the individual switch or the low-side-driver Tn represents a semiconductor defect that is encountered only above a defined voltage (Zener voltage). Consequently, the shunt would not be detected by the Zener diode Z when the circuit is tested with a testing source of low potential.

In the case of a fault, i.e., in the event of a leakage current to ground via R1 or KZ, or to the auxiliary source VCC5 via R2, the current impressed by the testing current source 3 will be discharged and thereby prevent the potential on the supply line REF from rising beyond a determined value. The difference of the input voltages becomes too high on comparator 5, the predetermined threshold value (of 1.2 volt, for example) is exceeded, and closing of the switch 2 and, thus, the main switch MD is prevented by way of logic 1.

The illustrated anti-parallel circuit 6 of two further current sources and the voltage divider R3, R4 (shown on the left side of a dash-dot line) with an associated voltage monitor 7 do not pertain to the basic components of the monitoring circuit of the present invention. These components are only inserted in FIG. 1 to represent that circuit parts, monitoring circuits, etc., which are provided for other reasons, may be connected without hindering the function of the leakage current monitoring system of the present invention. These additional components merely influence the allowable shunt or leakage current which must be predetermined when dimensioning the testing current source 3 and the threshold values of the comparator 5.

In case a leakage current appears downstream of the valve coils L1 to Ln, i.e., between the valve coils and the connection to ground, for example, due to shortcircuit KZ or shunt, or by way of Zener diode Z, a current is impressed in an inductive load during the testing operation triggered by activation of the testing current source 3. Therefore, the potential on the supply line REF will rise after the activation of the current source 3 until the inductance of the valve coil concerned permits a current flow in the magnitude of the load-independent current.

The increase in potential on the supply line REF will not occur instantaneously but only after a defined time interval which depends on the inductance of the respective valve coil L1 to Ln. Therefore, a defined delay time or waiting time $t_{Test}$ is predetermined until the potential variation is evaluated after the activation of the testing current source 3. Only after expiry of this waiting time or delay time will it be discovered whether the increase in potential is sufficient or the potential difference on the inputs of the comparator 5 is below the predetermined threshold value. The duration or waiting time $t_{Test}$ which must lapse until a leakage current or shunt is reliably identified depends on the inductance of the coils, the series resistances of the coils and the current source and, possibly, the threshold voltage or the Zener voltage.

Figure 2:
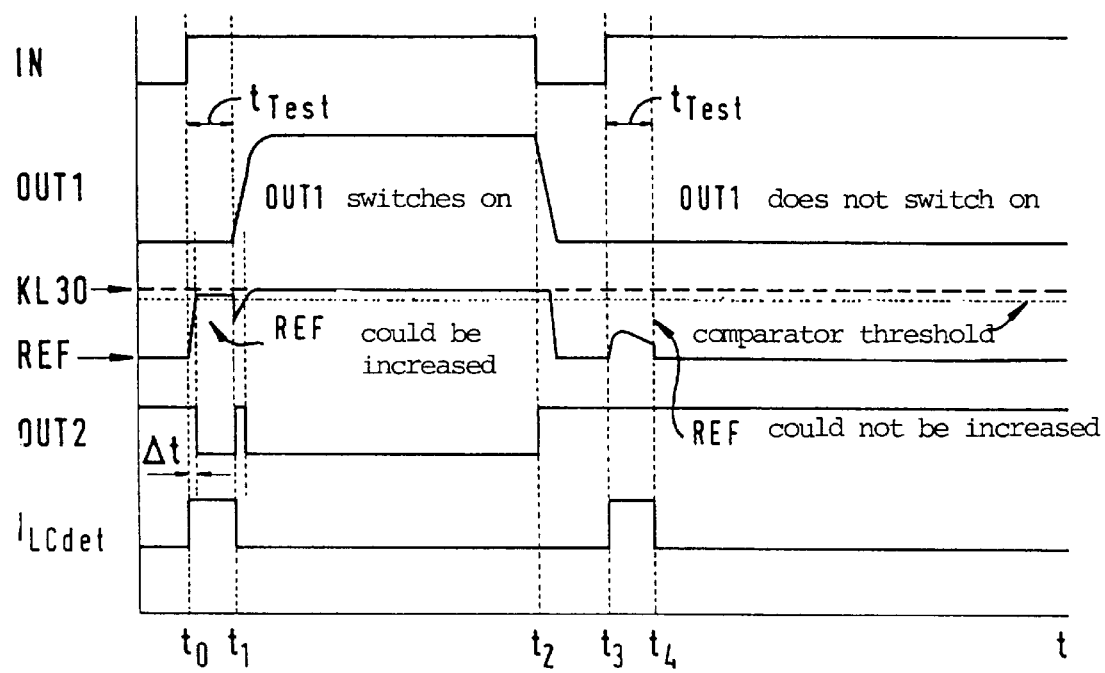
FIG. 2 is a graph of the signal course at various points of the circuit according to FIG. 1 during a testing or checking program run.

The graph of FIG. 2 illustrates the processes and potential variations during activation and after activation of a testing operation. The same time scale and course of time t applies for all curves. A signal IN appears at the input of logic 1 at time $t_0$. Due to a low capacitive load on the supply line REF, the potential on this line is increased after a very short delay time $\Delta t$. The comparator threshold was exceeded at time $t_0+\Delta t$, and the output signal OUT2 of comparator 5 changes. Thus, the potential of the supply line REF could be increased beyond the necessary threshold. The signal OUT2 will be evaluated upon expiry of the testing time $t_{Test}$ at the time $t_1$. Leakage current monitoring was successfully performed: no leakage current, or only a very small allowable amount of leakage current, has occurred in the circuit part tested. Therefore, switch 4 will be opened at time $t_1$, after expiry of the testing time $t_{Test}$, and the main switch or main driver MD will be closed by the signal OUT1 because the potential on the supply line REF almost adopted the value of the potential on the terminal KL30. The potential difference on the inputs of the comparator 5 was below a predetermined threshold value.

After deactivation or opening of the main switch MD at time $t_2$, closing of the main switch MD becomes necessary again at time $t_3$.

This can be seen in curve IN (IN is the input signal of logic 1). The testing current source 3 is activated at time $t_3$. In contrast to the testing procedure ($t_0$, $t_1$) described hereinabove, however, the reference potential REF is increased only slightly in the time period $t_{Test}$. Consequently, the comparator 5 registers an excessive potential difference between the potential on the terminal KL30 and the supply line REF, which potential difference is in excess of the predetermined threshold value. Thus, there is leakage current identification at time $t_4$, for what reason logic 1 (FIG. 1) prevents closing of the main switch MD.

Thus, the circuit arrangement of the present invention permits detecting leakage currents of different reasons, which are caused at any point in the circuit downstream of the main switch MD as long as the leakage current or shunt is greater than a minimum current determined by the specification of the load-independent current of the testing current source, and commences below a voltage which is predefined by the threshold voltage of the comparator 5 used for error detection. More particularly, 'leaks' of the low-side valve drivers T1 to Tn are detected which are caused by 'pinholes' and become apparent as Zener effects with voltages higher than 5 volt.

What is claimed is:

1. Circuit arrangement for monitoring leakage currents of a circuit which includes a plurality of inductive loads connected in parallel to a supply line and adapted to be connected to the second pole of a supply voltage source or to ground by way of individual switches, and wherein the supply line is adapted to be connected by way of a main switch to the first pole of the supply voltage source and, for leakage current checks, to a test signal source which causes a potential variation on the supply line that can be evaluated for leakage current detection, comprising:

a supply voltage source;

a main switch for connecting said supply voltage source to said plurality of inductive loads;

a test current source for providing a test signal on the supply line which is connected to the supply voltage source, means for activating said test current source prior to each closing of the main switch means for monitoring the voltage potential occurring across the supply line, and means for evaluating said voltage potential occurring across said supply line to determine if a leakage current is present.

2. Circuit arrangement as claimed in claim 1, wherein said monitoring means includes a comparator.

3. Circuit arrangement as claimed in claim 2, wherein said comparator is configured such that a predetermined maximum value of the potential voltage difference is maintained.

4. Circuit arrangement as claimed in claim 3, wherein the potential voltage difference is evaluated only after a defined delay time or waiting time which commences with the activation of the testing current source.

5. Circuit arrangement as claimed in claim 1, further including means for preventing closing of the main switch if the potential voltage difference exceeds the predetermined maximum value after the activation of the test current source or after the expiry of the delay time or waiting time.

* * * * *